(12) United States Patent
Suh et al.

(10) Patent No.: US 11,295,803 B2
(45) Date of Patent: Apr. 5, 2022

(54) MEMORY WITH DYNAMIC VOLTAGE SCALING

(71) Applicants: QUALCOMM Incorporated, San Diego, CA (US); Candace Sachi Chun, San Diego, CA (US)

(72) Inventors: Jungwon Suh, San Diego, CA (US); Michael Hawjing Lo, San Diego, CA (US); Dexter Tamio Chun, San Diego, CA (US); Xavier Loic Leloup, San Diego, CA (US); Laurent Rene Moll, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/945,303

(22) Filed: Jul. 31, 2020

(65) Prior Publication Data

US 2021/0065772 A1 Mar. 4, 2021

Related U.S. Application Data

(60) Provisional application No. 62/894,619, filed on Aug. 30, 2019.

(51) Int. Cl.
*G11C 5/14* (2006.01)
*G11C 11/4074* (2006.01)
*G11C 11/409* (2006.01)

(52) U.S. Cl.
CPC ........ *G11C 11/4074* (2013.01); *G11C 11/409* (2013.01)

(58) Field of Classification Search
CPC ............................ G11C 11/4074; G11C 11/409
(Continued)

(56) References Cited

U.S. PATENT DOCUMENTS

| | | | | |
|---|---|---|---|---|
| 6,346,737 B1* | 2/2002 | Higashitani | ....... | H01L 21/76202 257/315 |
| 6,597,617 B2* | 7/2003 | Ooishi | .............. | G11C 11/40615 365/222 |

(Continued)

FOREIGN PATENT DOCUMENTS

WO    2008017625 A2    2/2008

OTHER PUBLICATIONS

Invitation to Pay Additional Fees and Partial International Search for International Patent Application No. PCT/US2020/048593, dated Nov. 18, 2020, 15 pages.

(Continued)

*Primary Examiner* — Huan Hoang
(74) *Attorney, Agent, or Firm* — Qualcomm Incorporated

(57) ABSTRACT

Methods and apparatuses for to memories using dynamic voltage scaling are presented. The apparatus includes memory configured to communicate with a host. The memory includes a peripheral portion and a memory array. The memory is further configured to receive, from at least one power management circuit, a first supply voltage and a second supply voltage. The memory further includes a switch circuit. The switch circuit is configured to selectively provide the first supply voltage and the second supply voltage to the peripheral portion. The first supply voltage is static and has a first voltage range. The second supply voltage has a low second voltage range and a high second voltage range.

42 Claims, 7 Drawing Sheets

(58) Field of Classification Search
USPC .......................................................... 365/226
See application file for complete search history.

(56) References Cited

U.S. PATENT DOCUMENTS

| | | |
|---|---|---|
| 2010/0138684 A1 | 6/2010 | Kim et al. |
| 2013/0191665 A1* | 7/2013 | Mehta ................... G06F 1/3275 |
| | | 713/322 |
| 2013/0262792 A1 | 10/2013 | Barth, Jr. et al. |
| 2014/0313819 A1 | 10/2014 | Choi et al. |
| 2015/0378424 A1 | 12/2015 | Anyuru |
| 2017/0294216 A1 | 10/2017 | Doo et al. |
| 2018/0373314 A1 | 12/2018 | Stewart et al. |

OTHER PUBLICATIONS

International Search Report and Written Opinion for International Patent Application No. PCT/US2020/048593, dated Jan. 21, 2021, 20 pages.

\* cited by examiner

| DRAM | Symbol | | Frequency DC to 2Mhz Voltage Spec | | | | |
|---|---|---|---|---|---|---|---|
| | | | Min | Typical | Max | Unit | |
| Core 1 Power | VDD1 | | 1.7 | 1.8 | 1.95 | V | |
| Core 2 Power | VDD2H | | 1.01 | 1.05 | 1.12 | V | First voltage range |
| | VDD2P | Spec Range 1 (Low Power Mode - DVFSC) | 0.87 | 0.9 | 0.97 | V | Low second voltage range |
| | | Spec Range 2 (Performance Mode) | 1.11 | 1.15 | 1.22 | V | High second voltage range |
| IO Power | VDDQ | Spec Range 1 | 0.47 | 0.5 | 0.57 | V | |
| | | Spec Range 2 | 0.27 | 0.3 | 0.37 | V | |
| | | Allowable Range | 0.27 | N/A | 0.57 | V | |

FIG. 3

| WCK Freq (Mhz) | | Operating Modes | | |
|---|---|---|---|---|
| Lower Limit (>) | Upper Limit(=<) | Normal | Low Power (DVFSC) | Performance |
| 20 | 267 | Yes | Yes | N/A |
| 267 | 534 | Yes | Yes | N/A |
| 534 | 800 | Yes | Yes | N/A |
| 800 | 1067 | Yes | N/A | N/A |
| 1067 | 1375 | Yes | N/A | N/A |
| 1375 | 1600 | Yes | N/A | N/A |
| 1600 | 1867 | Yes | N/A | N/A |
| 1867 | 2134 | Yes | N/A | N/A |
| 2134 | 2400 | Yes | N/A | N/A |
| 2400 | 2750 | Yes | N/A | N/A |
| 2750 | 3000 | Yes | N/A | N/A |
| 3000 | 3200 | Yes | N/A | N/A |
| 3200 | 3734 | N/A | N/A | Yes |
| 3734 | 4267 | N/A | N/A | Yes |

FIG. 4

MEMORY WITH DYNAMIC VOLTAGE SCALING

This application claims the priority benefit of U.S. Provisional Application Ser. No. 62/894,619, entitled "Memory with Dynamic Voltage Scaling" and filed on Aug. 30, 2019, which is expressly incorporated by reference herein in its entirety.

FIELD

The present disclosure relates generally to methods and apparatuses having memories with improved voltage supplies and more particularly, to memories using dynamic voltage scaling.

BACKGROUND

A computing device (e.g., a laptop, a mobile phone, etc.) may include one or several processors to perform various computing functions, such as telephony, wireless data access, and camera/video function, etc. A memory is an important component of the computing device. The processors may be coupled to the memory to perform the aforementioned computing functions. For example, the processors may fetch instructions from the memory to perform the computing function and/or to store within the memory temporary data for processing these computing functions, etc.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes a memory having a peripheral portion and a memory array. The memory is further configured to receive, from at least one power management circuit, a first supply voltage and a second supply voltage. The memory further includes a switch circuit. The switch circuit is configured to selectively provide the first supply voltage and the second supply voltage to the peripheral portion. The first supply voltage is static and has a first voltage range. The second supply voltage has a low second voltage range and a high second voltage range.

Another apparatus in accordance with at least one embodiment includes a host configured to communicate with a memory. The memory has a peripheral portion and a memory array. The host is configured to cause the memory to selectively provide a first supply voltage and a second supply voltage to the peripheral portion. The first supply voltage is static and has a first voltage range. The second supply voltage has a low second voltage range and a high second voltage range. The host is further configured to cause at least one power management circuit to set a level the second supply voltage.

A method to provide supply voltages to a peripheral portion of a memory is presented. The method includes receiving, by a memory from at least one power management circuit, a first supply voltage and a second supply voltage; providing selectively, by a switch circuit of the memory, the first supply voltage and the second supply voltage to a peripheral portion of the memory. The first supply voltage is static and has a first voltage range. The second supply voltage has a low second voltage range and a high second voltage range.

Another method to provide supply voltages to a peripheral portion of a memory is presented. The method includes communicating between a host and a memory, the memory comprising a peripheral portion and a memory array; causing, by the host, the memory to selectively provide a first supply voltage and a second supply voltage to the peripheral portion. The first supply voltage is static and has a first voltage range. The second supply voltage has a low second voltage range and a high second voltage range. The method further includes causing, by the host, at least one power management circuit to set a level of the second supply voltage.

BRIEF DESCRIPTION OF THE DRAWINGS

Various aspects of apparatus and methods will now be presented in the detailed description by way of example, and not by way of limitation, with reference to the accompanying drawings, wherein:

FIG. 3 illustrates supply voltage ranges of the apparatus of FIG. 2, in accordance with certain aspects of the present disclosure.

FIG. 4 illustrates data clock frequency ranges and operating modes of the apparatus of FIG. 2, in accordance with certain aspects of the present disclosure.

DETAILED DESCRIPTION

Figure 1:
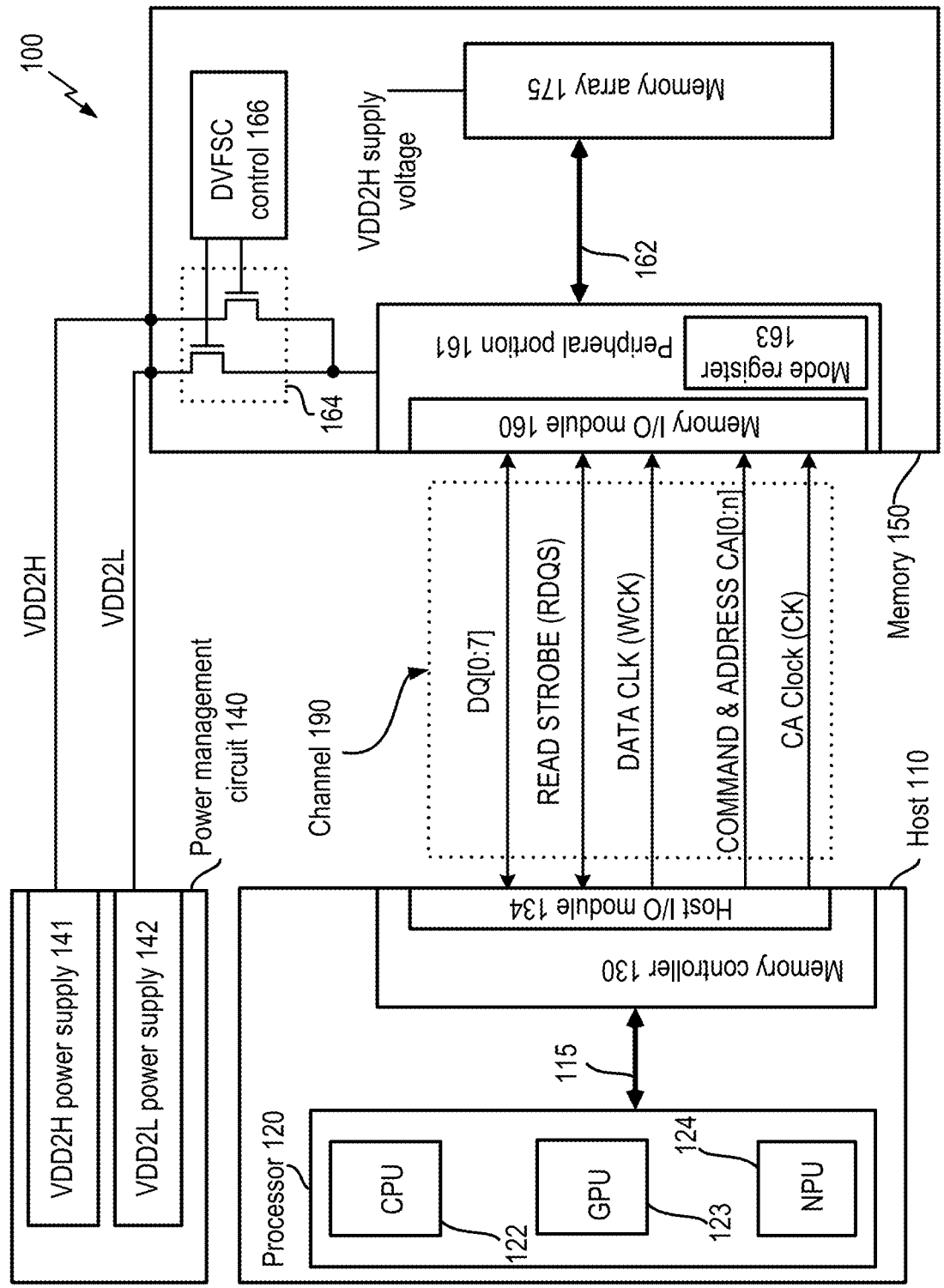
FIG. 1 illustrates an apparatus incorporating a host, a memory, and a channel coupling the host and the memory.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" mean a transfer of electrical energy between elements A and B, to operate certain intended functions.

In some examples, the term "electrically connected" may mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. are employed for ease of reference and may not carry substantive meanings. Likewise, names for components/modules may be adopted for ease of reference and might not limit the components/modules. For example, such non-limiting names may include "dynamic voltage and frequency scaling core (DVFSC)" control module and the "dynamic frequency voltage scaling (DFVS)" control module. Modules and components presented in the disclosure may be implemented in hardware, software, or a combination of hardware and software. In some examples, the modules and components presented in the disclosure may be implemented in hardware only.

The term "bus system" may provide that elements coupled to the "bus system" may exchange information therebetween, directly or indirectly. In such fashion, the "bus system" may encompass multiple physical connections as well as intervening stages such as buffers, latches, registers, etc. A module may be implemented in hardware, software, or a combination of hardware and software. The term "to cause" and all its variants may mean to effect, to enable, or to instruct.

Memories in the present disclosure may be embedded within a processor on a semiconductor die or be part of a different semiconductor die. The memories may be of various kinds. For example, the memory may be static random access memory (SRAM), dynamic random access memory (DRAM), magnetic random access memory (MRAM), NAND flash, or NOR flash, etc.

Methods and apparatuses are presented in the present disclosure by way of non-limiting examples of Low-Power Double Data Rate (LPDDR) Synchronous Dynamic Random Access Memory (SDRAM). For example, the LPDDR memory operating in accordance with LPDDR specification promulgated by Joint Electronic Device Engineering Council (JEDEC). One such LPDDR specification may be LPDDR5.

As demands grow for the computing device to perform more functions with increasing speed, power issue grows as well. For example, the demands for the various functions may call for the computing device to operate on increased power to take on critical or demanding tasks, while a low power mode would be preferred for other tasks to reduce overall power consumptions. While such flexibility may be of particular interest in mobile computing devices, non-mobile devices may also benefit from features. The present disclosure provides apparatus and methods to utilize dynamic supply voltages to a memory to provide performance and low power flexibility needed in computing devices. In such fashion, overall power consumption may be reduced, while meeting performance demands.

In some examples, mobile DRAM process might need to meet both the low power requirement and to operate in low voltage operation. To meeting these demands, a DRAM process may incorporate different types of transistors/processes for a memory array and a peripheral portion of a DRAM. For examples, the memory array may be adapted to reduce leakage current (to prolong storage time), while the peripheral portion may be adapted, for example, via faster transistors and more routing layers, to better performance (e.g. to reduce latency). To support future mobile dram (LPDDR5 for example) performance increase and latency reduction, the present disclosure provides a way to increase LPDDR5 performance by applying system assist-dynamic voltage scaling scheme to a power rail while still maintaining functional backward compatibility to existing JEDEC LPDDR5 products.

FIG. 1 illustrates an apparatus 100 incorporating a host 110, a memory 150, and a channel 190 coupling the host and the memory. The apparatus 100 may be, for example, a device among computing systems (e.g., servers, datacenters, desktop computers), mobile computing device (e.g., laptops, cell phones, vehicles, etc.), Internet of Things devices, virtual reality (VR) systems, or augmented reality (AR) systems, etc. The host 110 may include at least one processor 120, such as central processing unit (CPU), graphic processing unit (GPU), digital signal processor (DSP), multimedia engine, and/or neural processing unit (NPU). The host 110 may be configured to couple and to communicate to the memory 150, via a channel 190, in performing the computing functions. Such computing function may include data processing, data communication, graphic display, camera, AR or VR rendering, image processing, neural processing, etc. For example, the memory 150 may store instructions or data for the host 110 to perform the aforementioned computing functions. In FIG. 1, The host 110 is illustrated to include at least one processor 120, which may include a CPU 122, a GPU 123, and/or an NPU 124.

For ease of reference, read and write are referenced from a perspective of the host 110. For example, in a read operation, the host 110 may receive via the channel 190 data stored from the memory 150. In a write operation, the host 110 may provide via the channel 190 data to be written into the memory 150 for storage. The host 110 may include a memory controller 130, which may include a host input/output (I/O) module 134. The host I/O module 134 may couple to the memory 150, via the channel 190. The memory controller 130 may be configured to control various aspects, such as logic layers, of communications to and from the memory 150. The host I/O module 134 may be configured to control electrical characteristics (e.g., voltage levels, phase, delays, frequencies, etc.) of signals provided or received on the channel 190.

In some examples, the memory 150 may be an LPDDR DRAM (e.g., LPDDR5). The host 110, the memory 150, and/or the channel 190 may operate according to an LPDDR (e.g., LPDDR5) specification. In some examples, the channel 190 may include 16 or 32 bits of data (e.g., 16 DQs). In FIG. 1, the channel 190 is shown with 8 bits DQs for illustrative purpose. The channel 190 may include a data clock (e.g., WCK). The data clock may be utilized to clock data received by either the host 110 or the memory 150. For example, the data clock WCK may be used by the host 110 to provide data to the memory 150 in a write operation.

The channel 190 may further include command and address (e.g., CA) and associated CA clock (CK) to provide commands (e.g., read or write commands) to the memory 150. The channel may further include a read data strobe RDQS. In a read operation, the memory 150 may provide the read data strobe RDQS to the host 110 to allow the host 110 to receive read data on the DQs.

The memory 150 may include a memory array 175 and a peripheral portion 161, coupled via a bus system 162. The memory array 175 may include multiple memory cells (e.g., DRAM memory cells) that store data. The host 110 may read data stored in the memory array 175 and write data into the memory array 175, via the channel 190. The peripheral portion 161 may include various circuits to operate the memory 150. For example, the peripheral portion may include one or more of command decoding circuits, input/output latches, mode registers, etc.

FIG. 1 illustrates the peripheral portion 161 includes a memory I/O module 160 (e.g., a PHY layer) configured to control electrical characteristics (e.g., voltage levels, phase, delays, frequencies, etc.) to provide or to receive signals on the channel 190. For example, memory I/O module 160 may be configured to capture (e.g., to sample) data, commands, and addresses from the host 110 via the channel 190 (in a write operation) and to output data to the host 110 via the channel 190 (in a read operation). The peripheral portion 161 further includes a mode register 163, which may include multiple physical registers. The mode register 163 may indicate various operating conditions and operating modes to the memory 150 and/or to the host 110. The mode register 163 may be configured to be accessed differently from the memory array 175. For example, the mode register 163 may be accessed via a mode register read/write command, different from data read/write commands to access the memory array 175.

The memory 150 may be configured to receive and to operate on a VDD2H power supply configured to provide a supply voltage VDD2H and a VDD2L power supply configured to provide a supply voltage VDD2L. one or at least one power management circuit 140 may be external to the memory 150 (e.g., on a different die) and incorporate the VDD2H and the VDD2L power supplies. The at least one power management circuit 140 may include, for example, a power management integrated circuit or PMIC. The power supplies or rails carrying the supply voltage VDD2H and the supply voltage VDD2L, external or within the memory 150, may be isolated to reduce interference. The memory array 175 may be configured to operate on the supply voltage VDD2H. The peripheral portion 161 may be configured to operate on the supply voltage VDD2H or the supply voltage VDD2L.

In some examples, the supply voltage VDD2H and the supply voltage VDD2L may be static in that each operates in a voltage range. A voltage range may include a minimum voltage and a maximum voltage, within which a circuit is configured to operate, and a typical voltage between the minimum voltage and the maximum voltage. The memory 150 may utilize voltage scaling by, for example, having the peripheral portion 161 selectively operating on the supply voltage VDD2H and the supply voltage VDD2L. Accordingly, the memory 150 may include a switch circuit 164 and a dynamic voltage and frequency scaling core (DVFSC) control module 166. The switch circuit 164 may be configured selective provide the supply voltage VDD2H and the supply voltage VDD2L to the peripheral portion 16 to switch a power supply of the peripheral portion 161. The DVFSC control module 166 may be configured to control the switch circuit 164 to effect the power supply switch. In such fashion, the memory 150 (e.g., the switch circuit 164) may switch the power supply of the peripheral portion 161 to a lower supply voltage (e.g., the supply voltage VDD2L) for a low power mode.

Figure 2:
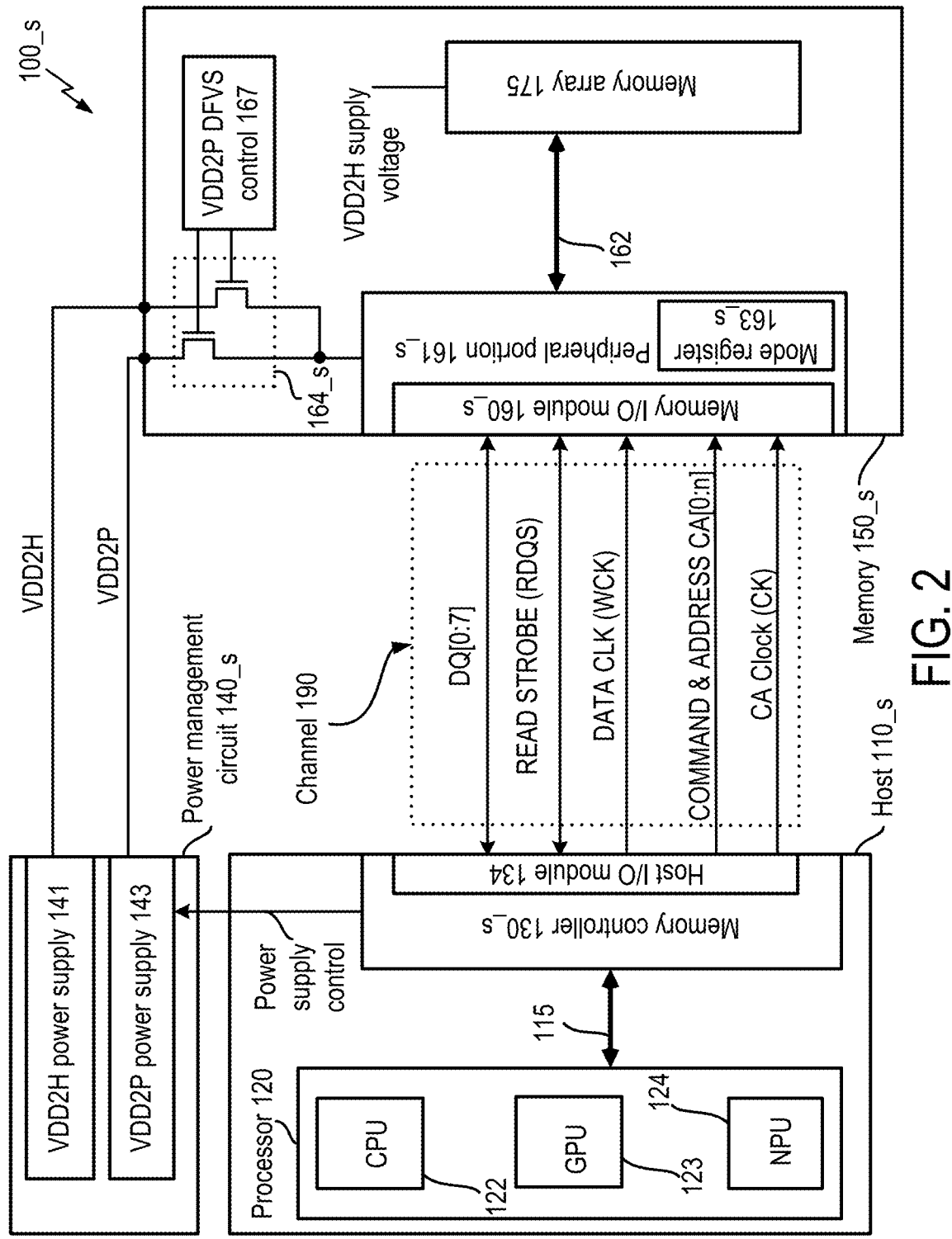
FIG. 2 illustrates an embodiment of an apparatus having a host, a memory, and a channel coupling the host and the memory, in accordance with certain aspects of the present disclosure.

FIG. 2 illustrates an embodiment of an apparatus 100_s having a host 110_s, a memory 150_s, and a channel 190 coupling the host 110_s and the memory 150_S, in accordance with certain aspects of the present disclosure. General or background information presented with the apparatus 100 of FIG. 1 is applicable to the apparatus 100_s, which certain differences are presented herein. In some examples, the apparatus 100_s may be configured to utilize a power supply with dynamic voltage scaling (e.g., having multiple voltage ranges) to meet requirements of a low power mode and a performance mode.

FIG. 2 illustrates the apparatus 100_s having a host 110_s and a memory 150_s, the host 110_s and the memory 150_s being configured to communicate via the channel 190. The memory 150_s may include a peripheral portion 161_s and the memory array 175. The memory 150_s may be configured to receive, from at least one power management circuit 140_s, the supply voltage VDD2H and a supply voltage VDD2P. The supply voltage VDD2H may be reference as a first supply voltage, and the supply voltage VDD2P may be referenced as a second supply voltage.

In some examples, the at least one power management circuit 140_s may be a PMIC external to the memory 150_s (e.g., on a different die as the memory 150_s). The at least one power management circuit 140_s may include the VDD2H power supply 141 configured to provide the supply voltage VDD2H and a VDD2P power supply 143 configured to provide the supply voltage VDD2P. Power rails carrying the supply voltage VDD2H and the supply voltage VDD2P, outside or inside the memory 150_s, may be isolated to reduce interference.

The peripheral portion 161_s may include a memory I/O module 160_s and a mode register 163_s. The memory I/O module 160_s (e.g., PHY layer) may be configured to control electrical characteristics (e.g., voltage levels, phase, delays, frequencies, etc.) to provide or to receive signals on the channel 190. The mode register 163_s may indicate various operating conditions and operating modes to the memory 150 and/or to the host 110. The mode register 163_s may be configured to be accessed differently from the memory array 175. For example, the mode register 163_s may be accessed via a mode register read/write command, different from data read/write commands to access the memory array 175. The peripheral portion 161_s (e.g., the memory I/O module 160_s and/or the mode register 163_s) may be configured to selectively operate on the supply voltage VDD2H and the supply voltage VDD2P. For example, the peripheral portion 161_s on different supply voltages at different time periods or for different operations.

The memory 150_s may further include a switch circuit 164_s and a VDD2P dynamic frequency voltage scaling (DFVS) control module 167. The switch circuit 164_s may be configured to switch a power supply of the peripheral portion 161_s (e.g., configured to selectively provide the VDD2H supply voltage and the VDD2P supply voltage to the peripheral portion 161_s). The VDD2P DFVS control module 167 may be configured to control the switch circuit 164_s to effect the power supply switch. In such fashion, the peripheral portion 161_s may selectively operate on the supply voltage VDD2H and the supply voltage VDD2P.

FIG. 3 illustrates supply voltage ranges of the apparatus of FIG. 2, in accordance with certain aspects of the present disclosure. In some examples, the supply voltage VDD2H (provided by the VDD2H power supply 141) may be static. For example, the supply voltage VDD2H may have only a first voltage range. The first voltage range may have a minimum voltage of 1.01 V, a maximum voltage of 1.12 V, and a typical voltage of 1.05 V. The supply voltage VDD2P may be dynamic and have multiple voltage ranges. For example, at one time, the supply voltage VDD2P may be in one voltage range among the multiple voltage ranges, and at different times, the supply voltage VDD2P may be in different ones of the multiple voltage ranges.

In some examples, the supply voltage VDD2P (provided by the VDD2P power supply 143) may have a low second voltage range and a high second voltage range. For example, the low second voltage range may have a minimum voltage of 0.87 V, a maximum voltage of 0.97 V, and a typical voltage of 0.9 V. The high second voltage range may have a minimum voltage of 1.11 V, a maximum voltage of 1.22 V, and a typical voltage of 1.15 V. In some examples, a voltage range being higher or lower than another may be based on a comparison of the typical voltages (in other examples, comparisons of the maximum or minimum voltages may be used). The low second voltage range of the VDD2P supply voltage may be lower than the first voltage range of VDD2H supply voltage, and the high second voltage range of the VDD2P supply voltage being higher than the first voltage range of the VDD2H supply voltage.

Referring to FIG. 2, in some examples, the host 110_s may write into at least a portion of the mode register 163_s (which may include multiple physical registers) to instruct the memory 150_s to utilize the VDD2P supply voltage having the low second voltage range and the high second voltage range. For example, the memory 150_s (e.g., the switch circuit 164) may be configured to selectively provide the VDD2H supply voltage and the VDD2P supply voltage to the peripheral portion 161_s, based on the mode register 163_s. For example, in one setting, the mode register 163_s may instruct the memory 150_s (via the DVFSC control module 166 and the switch circuit 164) to provide the VDD2P supply voltage to the peripheral portion 161_s. Such setting may indicate a low power mode or a performance mode. In some examples, in another setting, the mode register 163_s may instruct the memory 150_s (via the DVFSC control module 166 and the switch circuit 164) to provide the VDD2H supply voltage to the peripheral portion 161_s. Such setting may indicate a normal mode or a performance mode.

In some examples, the memory 150_s may indicate to the host 110_s that the memory 150_s supports (e.g., enables) the supply voltage VDD2P (e.g., being configured to receive a supply voltage having multiple voltage ranges, such as the low second voltage range and the high second voltage range). For example, a portion or a setting of the mode register 163_s may be used for such indication. The portion of the mode register 163_s may be read only to the host 110_s.

The memory 150_s may be configured to receive from the host 110_s a data clock, such as the data clock WCK, operating in multiple frequency ranges (include a high frequency range and a low frequency range). The multiple frequency ranges may correspond to various operating modes. For example, the data clock WCK may operate in the high frequency range to increase operating speed of a memory access for a performance mode and/or operate in the low frequency range to reduce power usage for a low power mode. The data clock WCK may operate in a frequency range below the high frequency range for a normal mode.

In some examples, the switch circuit 164_s may be configured to provide the supply voltage VDD2P to the peripheral portion 161_s while the data clock WCK is operating in the low frequency (e.g., in the low power mode) and in the high frequency range (in the performance mode). In some examples, the switch circuit 164_s may be further configured to provide the supply voltage VDD2H to the peripheral portion 161_s while the data clock WCK is operating below the high frequency range (e.g., in a normal mode). The switch circuit 164_s may selectively provide the supply voltage VDD2P and the supply voltage VDD2H based on the mode register 163_s. Further details of these operating modes are presented with FIG. 4.

In some examples, the VDD2P power supply 143 may be configured to adjust or set levels of the supply voltage VDD2P (e.g., at the low second voltage ranges or the high second voltage range) based on the multiple frequency ranges of the data clock WCK. For example, the VDD2P power supply 143 may output the supply voltage VDD2P at the high second voltage range while the data clock is operating in the high frequency range (e.g., in the performance mode). The VDD2P power supply 143 may output the supply voltage VDD2P at the low second voltage range while the data clock is operating in the low frequency range (e.g., in the low power mode). In some examples, the VDD2P power supply 143 may be configured to transition the supply voltage VDD2P between the low second voltage range and the high second voltage range. Such transition may be performed while the switch circuit 164_s is providing the supply voltage VDD2H to the peripheral portion 161_s (see FIG. 5; presented further below).

Referring to FIG. 2, the host 110_s may be configured to read (or write) from (or to) the mode register 163_s, via the channel 190, by issuing to the memory 150_s a mode register read (or write) command. The host 110_s (e.g., the memory controller 130_s and the host I/O module 134) may be configured to provide the data clock WCK to the memory 150_s, the data clock WCK operating in multiple frequency ranges. The multiple frequency ranges may include a low frequency range and a high frequency range. The host 110_s may be further configured to cause the memory 150_s to selectively provide the supply voltage VDD2H and the supply voltage VDD2L to the peripheral portion 161_s of the memory 150_s. For example, the host 110_s may set the mode register 163_s to instruct the memory 150_s, via the VDD2P DFVS control module 167 and/or the switch circuit 164_s, to provide one of the supply voltage VDD2H and the supply voltage VDD2L to the peripheral portion 161_s.

The host 110_s (e.g., the memory controller 130_s) may be further configured to cause the at least one power management circuit 140_s to set a level of the supply voltage VDD2P. For example, the host 110_s (e.g., the memory controller 130_s) may be configured to provide power supply control signaling to the VDD2P power supply 143 to instruct the VDD2P power supply 143 to provide the supply voltage VDD2P at the low second voltage range or at the high second voltage range.

FIG. 4 illustrates data clock frequency ranges and operating modes of the apparatus of FIG. 2, in accordance with certain aspects of the present disclosure. As illustrates, the operating modes are correlated with or based on the data clock WCK frequency ranges. In the low power mode, the data clock WCK may operate in the low frequency range (e.g., 20 MHz-800 MHz) to reduce power consumption. In the performance mode, the data clock WCK may operate in the high frequency range (e.g., 3200 MHz-4267 MHz) to increase operating speed of the memory 150_s. In a normal mode (e.g., not the low power mode and not the performance mode), the data clock WCK may operate below the high frequency range (e.g., data clock WCK may be between 20 MHz and 3200 MHz).

In some examples, in the low power mode (the data clock WCK operating in the low frequency range) and in the performance mode (the data clock WCK operating in the high frequency mode), the memory 150_s (e.g., the switch circuit 164_s) may be configured provide the supply voltage VDD2P to the peripheral portion 161_s. In the normal mode (the data clock WCK operating below the high frequency range; note that the data WCK may operate in the low frequency range in the normal mode), the memory 150_s (e.g., the switch circuit 164_s) may be configured provide the supply voltage VDD2H to the peripheral portion 161_s. In terms of operating frequency ranges of the data clock WCK, the low frequency range may correspond to the low power mode ore the normal mode. The performance mode may correspond to the high frequency range. In the normal mode, the data clock WCK may operate below the high frequency range (including the low frequency range and a frequency range between the low frequency range and the high frequency range).

Accordingly, referring to FIG. 2, the host 110_s may be configured to cause the memory 150_s (e.g., the switch circuit 164_s) to provide the supply voltage VDD2P to the peripheral portion 161_s while the data clock WCK is operating in the low frequency range (the low power mode) and in the high frequency range (the performance mode). Further, the host 110_s may be configured to cause the at least one power management circuit 140_s (e.g., the VDD2P power supply 143) to provide the supply voltage VDD2P at the high second voltage range while the data clock is operating in the high frequency range (the performance mode). In such fashion, the peripheral portion 161_s may operate at the high second voltage range of the supply voltage VDD2P to improve performance; the high second voltage range of the supply voltage VDD2P may be higher than the first voltage range of the supply voltage VDD2H (see FIG. 3).

Further, the host 110_s may be further configured to cause the at least one power management circuit 140_s (e.g., the VDD2P power supply 143) to provide the supply voltage VDD2P at the low second voltage range while the data clock WCK is operating in the low frequency range (low power mode). In such fashion, the peripheral portion 161_s may operate at the low second voltage range of the supply voltage VDD2P to reduce power consumption. The low second voltage range of the supply voltage VDD2P may be lower than the first voltage range of the supply voltage VDD2H (see FIG. 3).

The host 110_s may be further configured to write into the mode register 163_s in the memory 150_S (e.g., via the channel 190 and by way of a mode register write command) a setting to indicate to the memory 150_s to selectively provide the supply voltage VDD2H and the supply voltage VDD2P to the peripheral portion 161_s. For example, the switch circuit 164_s may select one of the supply voltage VDD2H and the supply voltage VDD2P to provide to the peripheral portion 161_s based on the setting of the mode register 163_s. In some examples, the host 110_s may be further configured to cause the memory 150_s (e.g., the switch circuit 164s) to provide the supply voltage VDD2H to the peripheral portion 161_s while the data clock WCK is operating below the high frequency range (e.g., in the normal mode). For example, the switch circuit 164_s may select the supply voltage VDD2H to provide to the peripheral portion 161_s based on the setting of the mode register 163_s.

The host 110_s may be further configured to read from the mode register 163_s in the memory 150_s (e.g., via the channel 190 and by way of a mode register read command). A portion of the mode register 163_s may be configured to indicate to the host 110_s that the memory 150_s supports the supply voltage VDD2P having the low second voltage range and the high second voltage range. The portion of the mode register 163_s may be read only to the host 110_s.

Figure 5:
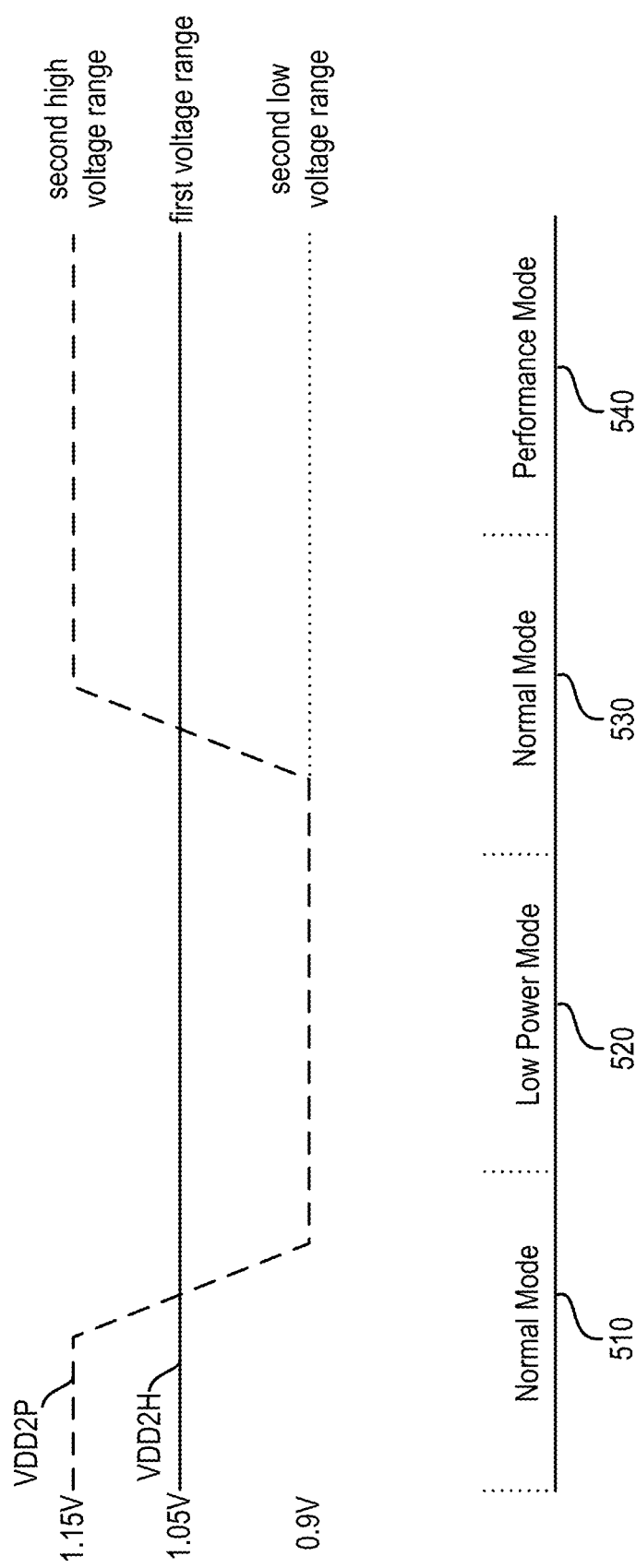
FIG. 5 illustrates supply voltage ranges per the operating modes of the apparatus of FIG. 2, in accordance with certain aspects of the present disclosure.

FIG. 5 illustrates supply voltage ranges per the operating modes of the apparatus 100_s of FIG. 2, in accordance with certain aspects of the present disclosure. The host 110_s may be further configured to cause the at least one power management circuit 140_s to transition the supply voltage VDD2P between the low second voltage range and the high second voltage range while the supply voltage VDD2H is being provided to the peripheral portion 161_s. In some examples, transitioning from the low power mode to the performance mode, and vice versa, may require an intervening normal mode. For example, in the normal mode 510, the switch circuit 164_s may select and provide the supply voltage VDD2H to the peripheral portion 161_s. The host 110_s may cause the at least one power management circuit 140_s (e.g., the VDD2P power supply 143) to transition the supply voltage VDD2P from the high second voltage range to the low second voltage range. With the supply voltage VDD2P stabilized at the low second voltage range, the apparatus 100_s may move to the low power mode 520.

In the low power mode 520, the switch circuit 164_s may select and provide the supply voltage VDD2P at the low second voltage range to the peripheral portion 161_s. In the normal mode 530, the switch circuit 164_s may select and provide the supply voltage VDD2H to the peripheral portion 161_s. The host 110_s may cause the at least one power management circuit 140_s (e.g., the VDD2P power supply 143) to transition the supply voltage VDD2P from the low second voltage range to the high second voltage range. With the supply voltage VDD2P stabilized at the high second voltage range, the apparatus 100_s may move to the performance power mode 540.

Accordingly, the peripheral portion 161_s may be configured to receive (via the switch circuit 164_s) and to operate on a sequence of the supply voltage VDD2P at the low second voltage range (the low power mode 520), and the supply voltage VDD2H at the first voltage range (the normal mode 530), and the supply voltage VDD2P at the high second voltage range (the performance mode 540) in a low-power-mode-to-performance-mode transition. Likewise, in a performance-mode-to-low-power-mode transition (not shown in the figure), the peripheral portion 161_s may be configured to receive (via the switch circuit 164_s) and to operate on a sequence of the supply voltage VDD2P at the high second voltage range (performance mode), and the supply voltage VDD2H at the first voltage range (normal mode), and the supply voltage VDD2P at the low second voltage range (low power mode).

Figure 6:
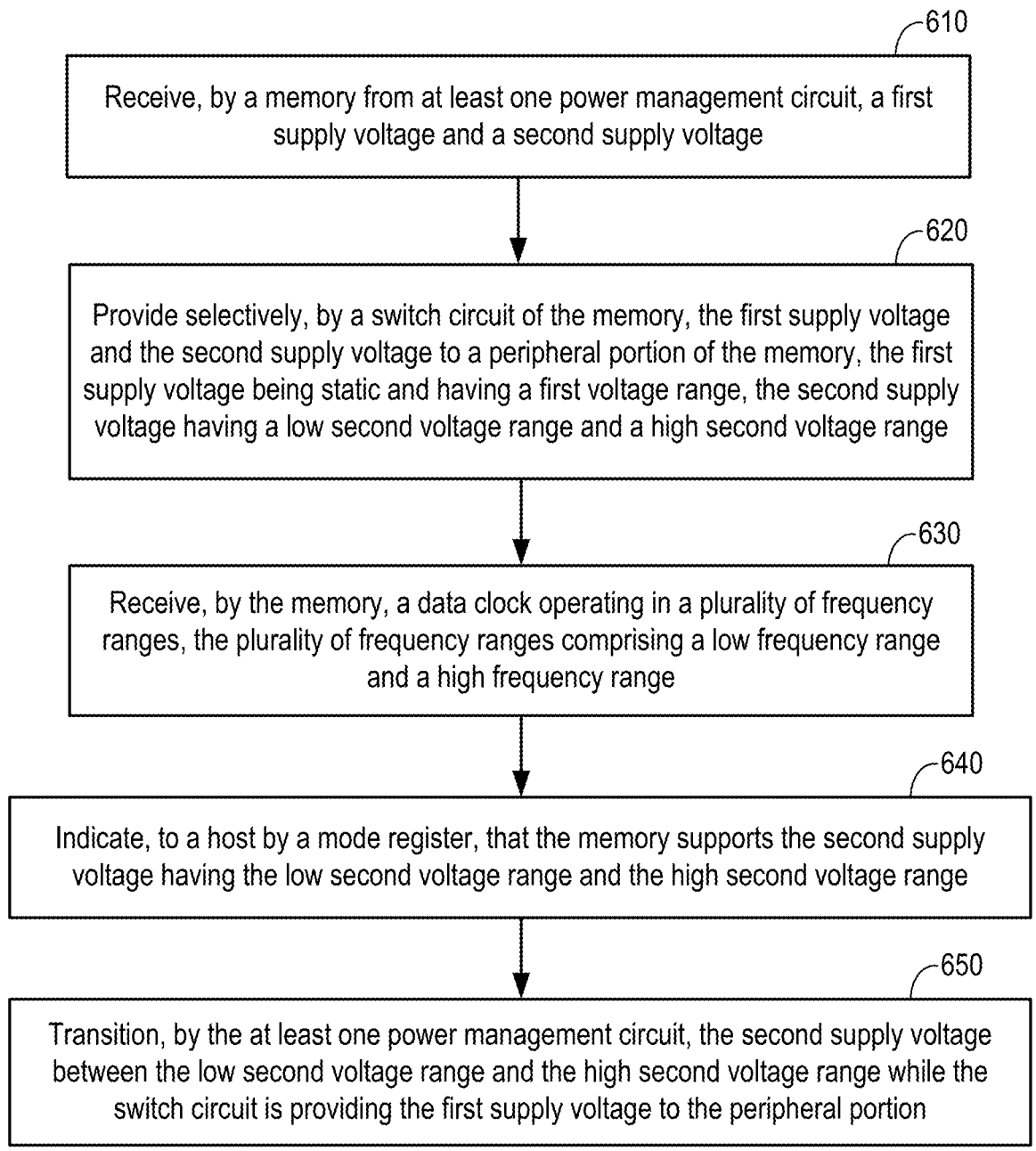
FIG. 6 illustrates a method to operate dynamic voltage scaling for the apparatus of FIG. 2, in accordance with certain aspects of the disclosure.

FIG. 6 illustrates a method to operate dynamic voltage scaling for the apparatus 100_s of FIG. 2, in accordance with certain aspects of the disclosure. The operations of FIG. 6 may be implemented by, for example, the apparatus 100_s presented with FIGS. 2-5. The arrows indicate certain relationships among the operations, but not necessarily sequential relationships. At 610, a first supply voltage and a second supply voltage are received by a memory from at least one power management circuit. For examples, referring to FIG. 2, the memory 150_s receives the supply voltage VDD2H and the supply voltage VDD2P from the at least one power management circuit 140_s.

At 620, the first supply voltage and the second supply voltage are selectively provided by a switch circuit of the memory to a peripheral portion of the memory. The first supply voltage is static and has a first voltage range. The second supply voltage has a low second voltage range and a high second voltage range. For example, referring to FIG. 2, the switch circuit 164_s selectively provides the supply voltage VDD2H and the supply voltage VDD2P to the peripheral portion 161_s of the memory 150_s. The supply voltage VDD2H is static and has only one voltage range (the first voltage range). The supply voltage VDD2P is dynamic and has a low second voltage range and a high second voltage range. See FIG. 3 for the voltage ranges. The supply voltage VDD2P may be adjusted or transitioned between the voltage ranges to dynamically scale a power supply to the peripheral portion 161_s.

At 630, a data clock operating in a plurality of frequency ranges is received by the memory. The plurality of frequency ranges includes a low frequency range and a high frequency range. For example, referring to FIG. 2, the memory 150_s receives the data clock WCK from the host 110_s, via the channel 190. The data clock WCK operates in multiple frequency ranges, including the low frequency range and the high frequency range. See FIG. 4 for the multiple frequency ranges.

At 640, a host is indicated by a mode register of the memory that the memory supports the second supply voltage having the low second voltage range and the high second voltage range. For example, referring to FIG. 2, a setting or a portion of the mode register 163_s indicates to the host 110_s (e.g., read by the host 110_s via a mode register read) that the memory 150_s supports the supply voltage VDD2P having the low second voltage range and the high second voltage range.

At 650, the second supply voltage is transitioned by the at least one power management circuit between the low second voltage range and the high second voltage range while the switch circuit is providing the first supply voltage to the peripheral portion. For example, referring to FIG. 6, the host 110_s causes (e.g., instructs) the at least one power management circuit 140_s to transition the supply voltage VDD2P between the low second voltage range and the high second voltage range while the supply voltage VDD2H is being provided to the peripheral portion 161_s. For example, in the normal mode 510, the switch circuit 164_s selects and provides the supply voltage VDD2H to the peripheral portion 161_s. The host 110_s causes the at least one power management circuit 140_s (e.g., the VDD2P power supply 143) to transition the supply voltage VDD2P from the high second voltage range to the low second voltage range. With the supply voltage VDD2P stabilized at the low second voltage range, the apparatus 100_s may move to the low power mode 520.

Figure 7:
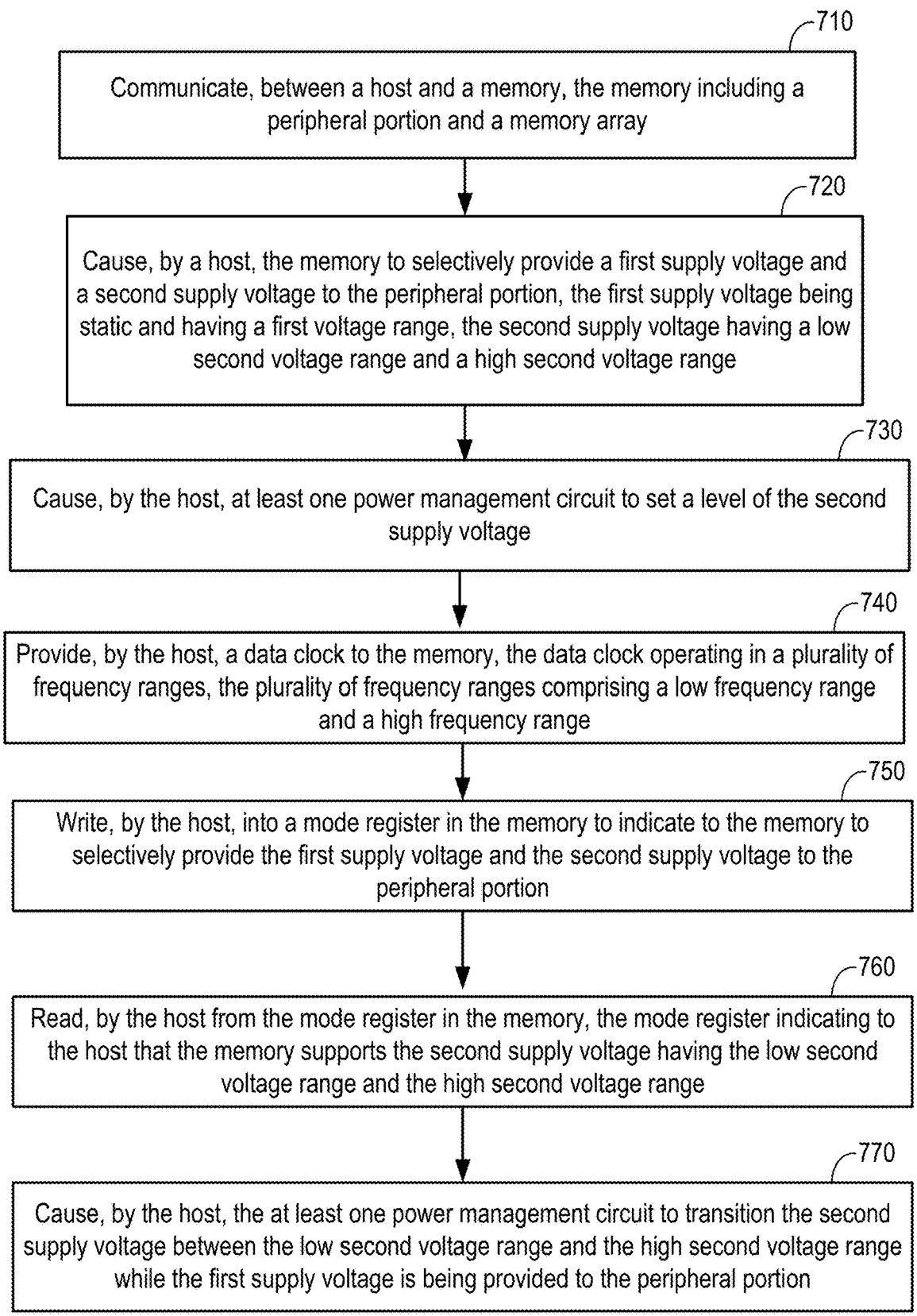
FIG. 7 illustrates another method to operate dynamic voltage scaling for the apparatus of FIG. 2, in accordance with certain aspects of the disclosure.

FIG. 7 illustrates another method to operate dynamic voltage scaling for the apparatus 100_s of FIG. 2, in accordance with certain aspects of the disclosure. The operations of FIG. 7 may be implemented by, for example, the apparatus 100_s presented with FIGS. 2-5. The arrows indicate certain relationships among the operations, but not necessarily sequential relationships. At 710, a host and a memory are communicated. The memory includes a peripheral portion and a memory array. Referring to FIG. 2, the host 110_s and the memory 150_s communicate via the channel 190. Such communication may include read, write, mode register read, mode register write, etc. The memory 150_s includes the peripheral portion 161_s and the memory array 175_s.

At 720, the memory is caused by the host to selectively provide a first supply voltage and a second supply voltage to the peripheral portion. The first supply voltage is static and has a first range. The second supply voltage has a lower second voltage range and a higher second voltage range. For example, referring to FIG. 2, the host 110_s writes into the mode register 163_s an operating mode (e.g., a low power mode, a performance mode, or a normal mode). The switch circuit 164_s of the memory 150_s selectively provides the supply voltage VDD2H and the supply voltage VDD2P to the peripheral portion 161_s of the memory 150_s, based on the operating mode (thus, based on a setting of the mode register 163_s). The supply voltage VDD2H is static and has only one voltage range (the first voltage range). The supply voltage VDD2P is dynamic and has a low second voltage range and a high second voltage range. See FIG. 3 for the voltage ranges.

At 730, at least one power management circuit is caused by the host to set a level of the second supply voltage. For example, referring to FIG. 2, the memory controller 130_s of the host 110_s sends the power supply control signaling to the VDD2P power supply 143 of the at least one power management circuit 140_s. The power supply control signaling instructs the VDD2P power supply 143 to set a level of the supply voltage VDD2P, based on the operating modes. For example, the VDD2P power supply 143 would be instructed to set the supply voltage VDD2P to the low second voltage range in the low power mode. The VDD2P power supply 143 would be instructed to set the supply voltage VDD2P to the high second voltage range in the performance mode.

At 740, a data clock is provided by the host to the memory. The data clock operates in a plurality of frequency ranges. The plurality of frequency ranges includes a low frequency range and a high frequency range. For example, referring to FIG. 2, the host 110_s provides to the memory 150_the data clock WCK from the host 110_s, via the channel 190. The data clock WCK operates in multiple frequency ranges, including the low frequency range and the high frequency range. See FIG. 4 for the multiple frequency ranges.

At 750, a mode register in the memory is written into by the host to indicate to the memory to selectively provide the first supply voltage and the second supply voltage to the peripheral portion. For example, referring to FIG. 2, the host 110_s writes into the mode register 163_s via the channel 190 by way of a mode register write command. The host 110_s writes a setting in the mode register 163_s to instruct or to indicate to the memory 150_s to select one of the supply voltage VDD2H and the supply voltage VDD2P (e.g., by the VDD2P DFVS control module 167 and/or the switch circuit 164_s) to provide to the peripheral portion 161_s.

For example, referring to FIG. 2, the switch circuit 164_s selects and provides the supply voltage VDD2H (at the first voltage range) to the peripheral portion 161_s of the memory 150_s, in response to the setting of the mode register 163_s being the normal mode (the setting being written by the host 110_s). The switch circuit 164_s selects and provides the supply voltage VDD2P to the peripheral portion 161_s of the memory 150_s, in response to the setting of the mode register 163_s being the low power or the performance mode (the setting being written by the host 110_s). In the low power mode, the host 110_s provides the data clock WCK in the low frequency range (see FIG. 4) and causes the at least one power management circuit 140_s to provide the supply voltage VDD2P at the low second voltage range (see FIG. 3). Thus, the supply voltage VDD2P at the low second voltage range is provided to the peripheral portion 161_s in the low power mode. In the performance mode, the host 110_s provides the data clock WCK in the high frequency range (see FIG. 4) and causes the at least one power management circuit 140_s to provide the supply voltage VDD2P at the high second voltage range (see FIG. 3). Thus, the supply voltage VDD2P at the high second voltage range is provided to the peripheral portion 161_s is provided to the performance mode.

At 760, the mode register in the memory is read from by the host. The mode register indicates to the host that the memory supports the second supply voltage having the low second voltage range and the high second voltage range. For example, referring to FIG. 2, a setting or a portion of the mode register 163_s indicates to the host 110_s (e.g., read by the host 110_s via a mode register read) that the memory 150_s supports the supply voltage VDD2P having the low second voltage range and the high second voltage range.

At 770, the at least one power management circuit is caused by the host to transition the second supply voltage between the low second voltage range and the high second voltage range while the first supply voltage is being provided to the peripheral portion. For example, referring to FIG. 5, the host 110_s causes (e.g., instructs) the at least one power management circuit 140_s to transition the supply voltage VDD2P between the low second voltage range and the high second voltage range while the supply voltage VDD2H is being provided to the peripheral portion 161_s. For example, in the normal mode 510, the switch circuit 164_s selects and provides the supply voltage VDD2H to the peripheral portion 161_s. The host 110_s causes the at least one power management circuit 140_s (e.g., the VDD2P power supply 143) to transition the supply voltage VDD2P from the high second voltage range to the low second voltage range. With the supply voltage VDD2P stabilized at the low second voltage range, the apparatus 100_s moves to the low power mode 520.

In the low power mode 520, the switch circuit 164_s selects and provides the supply voltage VDD2P at the low second voltage range to the peripheral portion 161_s. In the normal mode 530, the switch circuit 164_s selects and provide the supply voltage VDD2H to the peripheral portion 161_s. The host 110_s causes the at least one power management circuit 140_s (e.g., the VDD2P power supply 143) to transition the supply voltage VDD2P from the low second voltage range to the high second voltage range. With the supply voltage VDD2P stabilized at the high second voltage range, the apparatus 100_s moves to the performance power mode 540.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. An apparatus, comprising:
a memory configured to communicate with a host, the memory comprising a peripheral portion and a memory array,
the memory being further configured to receive, from at least one power management circuit, a first supply voltage and a second supply voltage,
the memory further comprising a switch circuit, the switch circuit being configured to selectively provide the first supply voltage and the second supply voltage to the peripheral portion,
the first supply voltage being static and having a first voltage range,
the second supply voltage having a low second voltage range and a high second voltage range.

2. The apparatus of claim 1, the low second voltage range being lower than the first voltage range of the first supply voltage, and the high second voltage range being higher than the first voltage range of the first supply voltage.

3. The apparatus of claim 1, the memory being configured to receive a data clock operating in a plurality of frequency ranges, the plurality of frequency ranges comprising a low frequency range and a high frequency range.

4. The apparatus of claim 3, the switch circuit being configured to provide the second supply voltage to the peripheral portion in response to the data clock operating in the low frequency range and in response to the data clock operating in the high frequency range.

5. The apparatus of claim 4, the second supply voltage being at the high second voltage range in response to the data clock operating in the high frequency range.

6. The apparatus of claim 4, the second supply voltage being at the low second voltage range in response to the data clock operating in the low frequency range.

7. The apparatus of claim 1, the memory further comprising a mode register, the switch circuit being configured to selectively provide the first supply voltage and the second supply voltage to the peripheral portion, based on the mode register.

8. The apparatus of claim 7, the mode register being configured to indicate to the host that the memory supports the second supply voltage having the low second voltage range and the high second voltage range.

9. The apparatus of claim 4, the switch circuit being further configured to provide the first supply voltage to the peripheral portion in response to the data clock operating below the high frequency range.

10. The apparatus of claim 9, the second supply voltage transitions between the low second voltage range and the high second voltage range in response to the switch circuit providing the first supply voltage to the peripheral portion.

11. The apparatus of claim 1, further comprising a device selected from one of a computing system, a mobile computing system, an Internet of Things device, a virtual reality system, or an augmented reality system, the device incorporating the memory, the host, and the at least one power management circuit.

12. An apparatus, comprising:
a host configured to communicate with a memory,
the memory having a peripheral portion and a memory array,
the host being further configured
to cause the memory to selectively provide a first supply voltage and a second supply voltage to the peripheral portion, the first supply voltage being static and having a first voltage range, the second supply voltage having a low second voltage range and a high second voltage range, and
to cause at least one power management circuit to set a level of the second supply voltage.

13. The apparatus of claim 12, the low second voltage range being lower than the first voltage range of the first supply voltage, and the high second voltage range being higher than the first voltage range of the first supply voltage.

14. The apparatus of claim 12, the host being further configured to provide a data clock to the memory, the data clock operating in a plurality of frequency ranges, the plurality of frequency ranges comprising a low frequency range and a high frequency range.

15. The apparatus of claim 14, the host being further configured to cause the memory to provide the second supply voltage to the peripheral portion in response to the data clock operating in the low frequency range and in response to the data clock operating in the high frequency range.

16. The apparatus of claim 15, the host being further configured to cause the at least one power management circuit to provide the second supply voltage at the high second voltage range in response to the data clock operating in the high frequency range.

17. The apparatus of claim 15, the host being further configured to cause the at least one power management circuit to provide the second supply voltage at the low second voltage range in response to the data clock operating in the low frequency range.

18. The apparatus of claim 12, the host being further configured to write into a mode register in the memory to indicate to the memory to selectively provide the first supply voltage and the second supply voltage to the peripheral portion.

19. The apparatus of claim 18, the host being further configured to read from the mode register in the memory, the mode register being configured to indicate to the host that the memory supports the second supply voltage having the low second voltage range and the high second voltage range.

20. The apparatus of claim 15, the host being further configured to cause the memory to provide the first supply voltage to the peripheral portion in response to the data clock operating below the high frequency range.

21. The apparatus of claim 20, the host being further configured to cause the at least one power management circuit to transition the second supply voltage between the low second voltage range and the high second voltage range in response to the first supply voltage being provided to the peripheral portion.

22. The apparatus of claim 12, further comprising a device selected from one of a computing system, a mobile computing system, an Internet of Things device, a virtual reality system, or an augmented reality system, the device incorporating the host, the memory, and the at least one power management circuit.

23. A method to provide supply voltages to a peripheral portion of a memory, the method comprising:
receiving, by the memory from at least one power management circuit, a first supply voltage and a second supply voltage; and
providing selectively, by a switch circuit of the memory, the first supply voltage and the second supply voltage to the peripheral portion of the memory, the first supply voltage being static and having a first voltage range, the second supply voltage having a low second voltage range and a high second voltage range.

24. The method of claim 23, the low second voltage range being lower than the first voltage range of the first supply voltage, and the high second voltage range being higher than the first voltage range of the first supply voltage.

25. The method of claim 23, further comprising:
receiving, by the memory, a data clock operating in a plurality of frequency ranges, the plurality of frequency ranges comprising a low frequency range and a high frequency range.

26. The method of claim 25, wherein the switch circuit provides the second supply voltage to the peripheral portion in response to the data clock operating in the low frequency range and in response to the data clock operating in the high frequency range.

27. The method of claim 26, the second supply voltage being at the high second voltage range in response to the data clock operating in the high frequency range.

28. The method of claim 26, the second supply voltage being at the low second voltage range in response to the data clock operating in the low frequency range.

29. The method of claim 23, wherein the switch circuit selectively provides the first supply voltage and the second supply voltage to the peripheral portion, based on a mode register of the memory.

30. The method of claim 29, further comprising:
indicating, to a host by the mode register, that the memory supports the second supply voltage having the low second voltage range and the high second voltage range.

31. The method of claim 26, further comprising:
providing, by the switch circuit, the first supply voltage to the peripheral portion in response to the data clock operating below the high frequency range.

32. The method of claim 31, further comprising:
transitioning, by the at least one power management circuit, the second supply voltage between the low second voltage range and the high second voltage range in response to the switch circuit providing the first supply voltage to the peripheral portion.

33. A method to provide supply voltages to a peripheral portion of a memory, the method comprising:
communicating between a host and the memory;
causing, by the host, the memory to selectively provide a first supply voltage and a second supply voltage to the peripheral portion, the first supply voltage being static and having a first voltage range, the second supply voltage having a low second voltage range and a high second voltage range; and
causing, by the host, at least one power management circuit to set a level of the second supply voltage.

34. The method of claim 33, the low second voltage range being lower than the first voltage range of the first supply voltage, and the high second voltage range being higher than the first voltage range of the first supply voltage.

35. The method of claim 33, further comprising:
providing, by the host, a data clock to the memory, the data clock operating in a plurality of frequency ranges, the plurality of frequency ranges comprising a low frequency range and a high frequency range.

36. The method of claim 35, wherein the memory provides the second supply voltage to the peripheral portion in response to the data clock operating in the low frequency range and in response to the data clock operating in the high frequency range.

37. The method of claim 36, wherein the at least one power management circuit provides the second supply voltage at the high second voltage range in response to the data clock operating in the high frequency range.

38. The method of claim 36, wherein the at least one power management circuit provides the second supply voltage at the low second voltage range in response to the data clock operating in the low frequency range.

39. The method of claim 33, further comprising:
writing, by the host, into a mode register in the memory to indicate to the memory to selectively provide the first supply voltage and the second supply voltage to the peripheral portion.

40. The method of claim 39, further comprising:
reading, by the host from the mode register in the memory, the mode register indicating to the host that the memory supports the second supply voltage having the low second voltage range and the high second voltage range.

41. The method of claim 36, wherein the memory provides the first supply voltage to the peripheral portion in response to the data clock operating below the high frequency range.

42. The method of claim 41, further comprising:
causing, by the host, the at least one power management circuit to transition the second supply voltage between the low second voltage range and the high second voltage range in response to the first supply voltage being provided to the peripheral portion.

* * * * *